US011685989B2

(12) United States Patent
Miko et al.

(10) Patent No.: US 11,685,989 B2
(45) Date of Patent: Jun. 27, 2023

(54) METAL POWDER PARTICLES

(71) Applicant: THE SWATCH GROUP RESEARCH AND DEVELOPMENT LTD, Marin (CH)

(72) Inventors: Csilla Miko, Essertines-sur-Yverdon (CH); Jean-Luc Bazin, Tüscherz-Alfermée (CH)

(73) Assignee: THE SWATCH GROUP RESEARCH AND DEVELOPMENT LTD, Marin (CH)

( * ) Notice: Subject to any disclaimer, the term of this patent is extended or adjusted under 35 U.S.C. 154(b) by 628 days.

(21) Appl. No.: 16/628,355

(22) PCT Filed: Jun. 21, 2018

(86) PCT No.: PCT/EP2018/066615
§ 371 (c)(1),
(2) Date: Jan. 3, 2020

(87) PCT Pub. No.: WO2019/007699
PCT Pub. Date: Jan. 10, 2019

(65) Prior Publication Data
US 2020/0215607 A1 Jul. 9, 2020

(30) Foreign Application Priority Data
Jul. 7, 2017 (EP) .................................... 17180199

(51) Int. Cl.
*B22F 1/02* (2006.01)
*C23C 14/22* (2006.01)
(Continued)

(52) U.S. Cl.
CPC ................. *B22F 1/16* (2022.01); *B22F 1/00* (2013.01); *B22F 1/05* (2022.01); *B22F 1/052* (2022.01);
(Continued)

(58) Field of Classification Search
CPC .............. B22F 2301/10; B22F 2301/20; B22F 2301/00; B22F 2301/15; B22F 2301/35;
(Continued)

(56) References Cited

U.S. PATENT DOCUMENTS

| 2009/0212238 A1 | 8/2009 | Guernalec et al. |
| 2011/0076587 A1 | 3/2011 | Wang et al. |
| 2019/0112700 A1* | 4/2019 | Miko .................. C04B 35/584 |

FOREIGN PATENT DOCUMENTS

| FR | 2 962 136 A1 | 1/2012 |
| JP | 1-287202 A | 11/1989 |

(Continued)

OTHER PUBLICATIONS

International Search Report dated Nov. 30, 2018 in PCT/EP2018/066615 filed on Jun. 21, 2018, 3 pages.
(Continued)

*Primary Examiner* — Michael E. La Villa
(74) *Attorney, Agent, or Firm* — Oblon, McClelland, Maier & Neustadt, L.L.P.

(57) ABSTRACT

A method for surface treatment of a metal material in a powder state is provided, the method including obtaining a powder formed from a plurality of particles of the metal material to be treated; and subjecting the powder to an ion implantation process by directing a beam of singly-charged or multi-charged ions towards an outer surface of the particles, the beam being produced by a source of singly-charged or multi-charged ions, whereby the particles have an overall spherical shape with a radius (R). There is also provided a material in a powder state formed from a plurality of particles having a ceramic outer layer and a metal core, the particles having an overall spherical shape.

6 Claims, 7 Drawing Sheets

(51) Int. Cl.
  *C23C 14/48* (2006.01)
  *B22F 1/16* (2022.01)
  *B22F 1/05* (2022.01)
  *B22F 1/052* (2022.01)
  *B22F 1/17* (2022.01)
  *C23C 14/06* (2006.01)
  *B22F 1/054* (2022.01)
  *B22F 1/00* (2022.01)
  *B22F 3/11* (2006.01)
  *B22F 1/065* (2022.01)

(52) U.S. Cl.
  CPC .............. *B22F 1/054* (2022.01); *B22F 1/065* (2022.01); *B22F 1/09* (2022.01); *B22F 1/17* (2022.01); *B22F 3/1103* (2013.01); *C23C 14/0635* (2013.01); *C23C 14/0641* (2013.01); *C23C 14/221* (2013.01); *C23C 14/223* (2013.01); *C23C 14/48* (2013.01); *B22F 2302/00* (2013.01); *B22F 2302/10* (2013.01); *B22F 2302/15* (2013.01); *B22F 2302/20* (2013.01); *B22F 2302/35* (2013.01); *Y10T 428/12028* (2015.01); *Y10T 428/12181* (2015.01); *Y10T 428/12576* (2015.01); *Y10T 428/12625* (2015.01); *Y10T 428/12729* (2015.01); *Y10T 428/12736* (2015.01); *Y10T 428/12806* (2015.01); *Y10T 428/12875* (2015.01); *Y10T 428/12889* (2015.01); *Y10T 428/12896* (2015.01); *Y10T 428/2495* (2015.01); *Y10T 428/24942* (2015.01); *Y10T 428/2982* (2015.01); *Y10T 428/2991* (2015.01); *Y10T 428/2993* (2015.01)

(58) Field of Classification Search
  CPC ...... B22F 1/16; B22F 1/00; B22F 1/09; B22F 1/05; B22F 1/052; B22F 1/054; B22F 1/065; B22F 1/17; B22F 3/1103; C23C 14/223; C23C 14/48; C23C 14/221; C23C 14/064; C23C 14/0635; Y10T 428/12028; Y10T 428/12181; Y10T 428/12576; Y10T 428/12625; Y10T 428/12889; Y10T 428/12896; Y10T 428/12875; Y10T 428/12736; Y10T 428/12729; Y10T 428/12806; Y10T 428/2982; Y10T 428/2991; Y10T 428/2993; Y10T 428/2495; Y10T 428/24942

See application file for complete search history.

(56) References Cited

FOREIGN PATENT DOCUMENTS

| | | |
|---|---|---|
| JP | 04280902 A | 6/1992 |
| JP | 2003-147473 A | 5/2003 |
| SU | 1122420 A | 1/1985 |
| TW | I237374 | 8/2005 |
| WO | WO 2005/085491 A2 | 9/2005 |
| WO | WO 2008/037927 A2 | 4/2008 |
| WO | WO 2008/047049 A2 | 4/2008 |
| WO | WO 2011/020964 A1 | 2/2011 |

OTHER PUBLICATIONS

French Search Report dated Jan. 29, 2018 in French Application No. 17180199.6 issued on Jul. 7, 2017.

Notice of Reason for Refusal dated Jan. 5, 2021 in Japanese Patent Application No. 2019-571332 (with English language translation), 15 pages.

Notice of Grounds for Rejection dated Feb. 4, 2021 in Korean Patent Application No. 10-2020-7000178 (with English language translation), 10 pages.

Combined Taiwanese Office Action and Search Report dated Nov. 4, 2022 in Patent Application No. 107122560 (with English language translation), 12 pages.

* cited by examiner

METAL POWDER PARTICLES

TECHNICAL FIELD OF THE INVENTION

The present invention relates to a method for the surface treatment of particles of a metal material in the powder state, in addition to metal powder particles obtained by implementing such a method. The metal powder particles obtained by the method according to the invention are intended for use in the manufacture of solid parts using powder metallurgy methods such as the injection moulding method, better known as Metal Injection Moulding or MIM, pressing or additive manufacturing such as three-dimensional laser printing. This invention further relates to a particle of a metal powder with a ceramic surface and a metal core.

TECHNOLOGICAL BACKGROUND OF THE INVENTION

Ion implantation methods consist of bombarding the surface of an object to be treated, for example using a source of singly- or multi-charged ions of the electron cyclotron resonance type. Such an installation is referred to as Electron Cyclotron Resonance or ECR.

An ECR ion source uses electron cyclotron resonance to create a plasma. A volume of low-pressure gas is ionised by microwaves injected at a frequency corresponding to the electron cyclotron resonance defined by a magnetic field applied to a region located inside the volume of gas to be ionised. The microwaves heat the free electrons present in the volume of gas to be ionised. Under the effect of thermal agitation, these free electrons collide with the atoms or molecules of gas and cause the ionisation thereof. The ions produced correspond to the type of gas used. This gas can be pure or a compound. It can also be a vapour obtained from a solid or liquid material. The ECR ion source is capable of producing singly-charged ions, i.e. ions with a degree of ionisation equal to 1, or multi-charged ions, i.e. ions with a degree of ionisation greater than 1.

A multi-charged ion source of the ECR electron cyclotron resonance type is diagrammatically shown in FIG. 1 accompanying this patent application. Denoted as a whole by the general reference numeral 1, an ECR multi-charged ion source comprises an injection stage 2, into which a volume 4 of a gas to be ionised and a microwave 6 are introduced, a magnetic confinement stage 8, wherein a plasma 10 is created, and an extraction stage 12, which allows the ions of the plasma 10 to be extracted and accelerated using an anode 12a and a cathode 12b between which a high voltage is applied. A multi-charged ion beam 14 produced at the output of the ECR multi-charged ion source 1 strikes a surface 16 of a part to be treated 18 and penetrates relatively deeply within the volume of the part to be treated 18.

Ion implantation by bombardment of the surface of an object to be treated has numerous effects, including modifying the microstructure of the material of which the object to be treated is made, improving corrosion resistance, enhancing tribological properties and, more generally, improving mechanical properties. Several works have thus highlighted the increase in the hardness of copper and bronze by nitrogen ion implantation. It has also been proven that nitrogen or neon implantation in copper increases the fatigue strength thereof. Similarly, works have shown that nitrogen implantation, even at low doses ($1 \cdot 10^{15}$ and $2 \cdot 10^{15}$ ions·cm$^{-2}$), were sufficient to significantly change the shear modulus of copper.

It is thus understood that ion implantation by bombarding the surface of an object to be treated is highly advantageous from a scientific, technical and industrial perspective.

Nonetheless, the studies conducted to date only concern solid objects to be treated. However, such solid objects are limited by the shapes and geometry that can be given thereto using conventional machining techniques (drilling, milling, boring).

There was therefore a need, in the state of the art, for objects, whose mechanical properties are significantly improved while posing almost zero limits with regard to the shape that such objects could assume.

SUMMARY OF THE INVENTION

The purpose of this invention is to satisfy the aforementioned need and more by proposing a method for the surface treatment of a metal material allowing for the production of objects whose geometric shapes are virtually unrestricted, while having modified and improved physical and chemical properties.

For this purpose, this invention relates to a method for the surface treatment of a metal material, said method comprising the step of obtaining a powder formed from a plurality of particles of a metal material, and of directing a singly-charged or multi-charged ion beam towards a surface of said particles, said ion beam being produced by a singly-charged or multi-charged ion source, whereby the particles have an overall spherical shape.

According to preferred embodiments of the invention:
the singly-charged or multi-charged ion source is of the ECR electron cyclotron resonance type;
the particles of the metal powder are agitated throughout the duration of the ion implantation process;
the grain size of the particles of the metal powder used is such that substantially 50% of all of said particles have a diameter that lies in the range 1 to 2 micrometres, whereby the diameter of the particles of the metal powder used does not exceed 50 micrometres;
the metal material is a precious metal selected from the group comprising gold and platinum;
the metal material is a non-precious metal selected from the group comprising magnesium, titanium and aluminium;
the material to be ionised is chosen from the group comprising carbon, nitrogen, oxygen and argon;
the singly-charged or multi-charged ions are accelerated under a voltage in the range 15,000 to 35,000 volts;
the dose of ions implanted lies in the range $1 \cdot 10^{15}$ to $1 \cdot 10^{17}$ ions·cm$^{-2}$;
the maximum implantation depth of the ions is from 150 to 200 nm.

The present invention further relates to a particle of a metal powder with a ceramic surface and a metal core, and more particularly with a surface that corresponds to a carbide or a nitride of the metal of which the particles of the metal powder are made.

Thanks to these characteristics, the present invention provides a method for treating a metal material in the powder state, wherein the particles forming said powder retain their original metal structure in the deep-lying portions, whereas, from the surface as far as a given depth, the singly-charged or multi-charged ions with which the metal powder particles are bombarded fill the defects in the lattices of the crystallographic structure of the metal, then combine with the atoms of the metal material to form a ceramic, i.e. a material that is solid at ambient temperature and that is neither organic nor metallic.

It should be noted that the metal powder particles, after ion implantation treatment, are ready for use in powder metallurgy methods such as injection moulding, pressing or additive manufacturing such as three-dimensional laser printing. Moreover, since the surface of the metal powder particles is transformed into a ceramic, in particular into the carbide and/or nitride of the metal making up said particles, the mechanical and physical properties, in particular the hardness, the corrosion resistance or the tribological properties of said metal powder particles are improved. The improvement of the mechanical and physical properties of the metal powder particles is retained when said metal powders are used to produce solid parts.

Preferably, the particles forming the metal powder are agitated throughout the duration of the ion implantation treatment such that said particles are exposed to the ions of the implantation beam in a homogeneous manner over the entire substantially spherical surface thereof.

It should be noted that, in the prior art, one of the methods regularly used to obtain a material of the ceramic-metal type, referred to as "cermet", consists of mixing the metal and ceramic powders in the most homogeneous manner possible, which produces ceramic particles coated in a metal layer. However, this method raises the issue of how to precisely control the thickness of the metal layer and the quality of the interface between the metal layer and the ceramic core.

BRIEF DESCRIPTION OF THE FIGURES

Other characteristics and advantages of this invention will appear more clearly upon reading the following detailed description given of one example embodiment of the method according to the invention, said example being provided for illustrative purposes only and not intended to limit the scope of the invention, with reference to the accompanying drawing, wherein.

DETAILED DESCRIPTION OF ONE EMBODIMENT OF THE INVENTION

The present invention was drawn from the general inventive idea consisting of subjecting particles of a metal powder to a treatment process for implanting ions into the surface of said particles. By bombarding the particles of a metal powder with singly- or multi-charged ions having undergone significant acceleration under electrical voltages of about 15,000 to 35,000 volts, said ions are seen to begin to fill the defects in the lattices of the crystallographic structure of the metal, then are seen to combine with the atoms of the metal material to form a ceramic. Up to a certain depth from the surface of the metal powder particles, these are transformed into a ceramic, for example into a carbide or nitride of the metal of which the particles are made. Advantageously, the mechanical and physical properties, in particular the hardness, corrosion resistance or tribological properties of said metal powder particles with a ceramic surface layer are improved. The improvement of the mechanical and physical properties of the metal powder particles provided with a ceramic surface layer is retained when said metal powders are used to produce solid parts by powder metallurgy techniques such as injection moulding, pressing, additive manufacturing or other techniques. The term "additive manufacturing technique" is understood herein as consisting of the manufacture of a solid part by the addition of material. In the case of additive manufacturing techniques, a solid part is created by gradually adding a base raw material, whereas in conventional manufacturing techniques, a raw material is used as a basis and the desired final part is obtained by gradually removing material.

Figure 1:
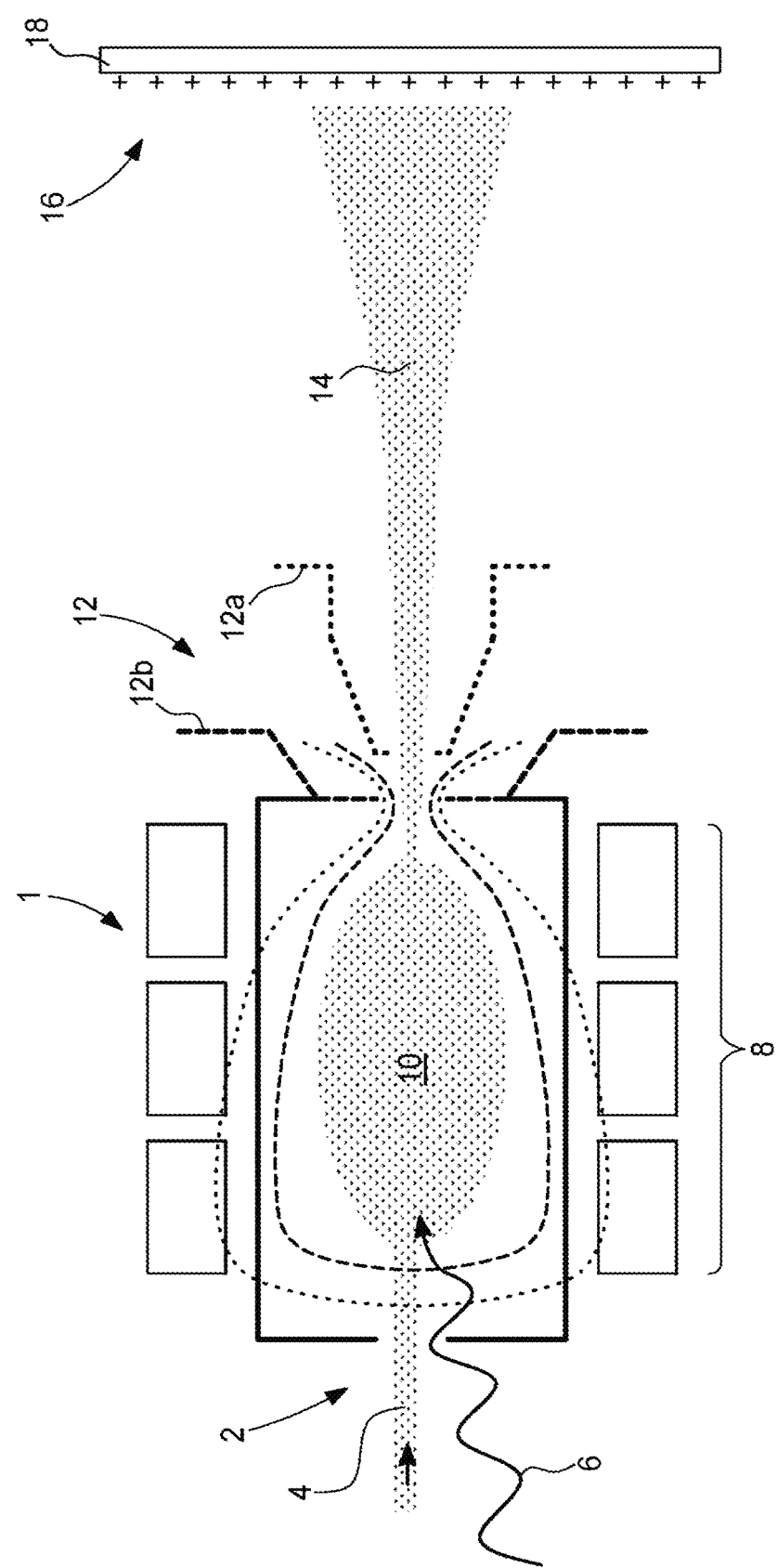
FIG. 1, mentioned hereinabove, is a diagrammatic view of a multi-charged ion source of the ECR electron cyclotron resonance type.
Figure 2:
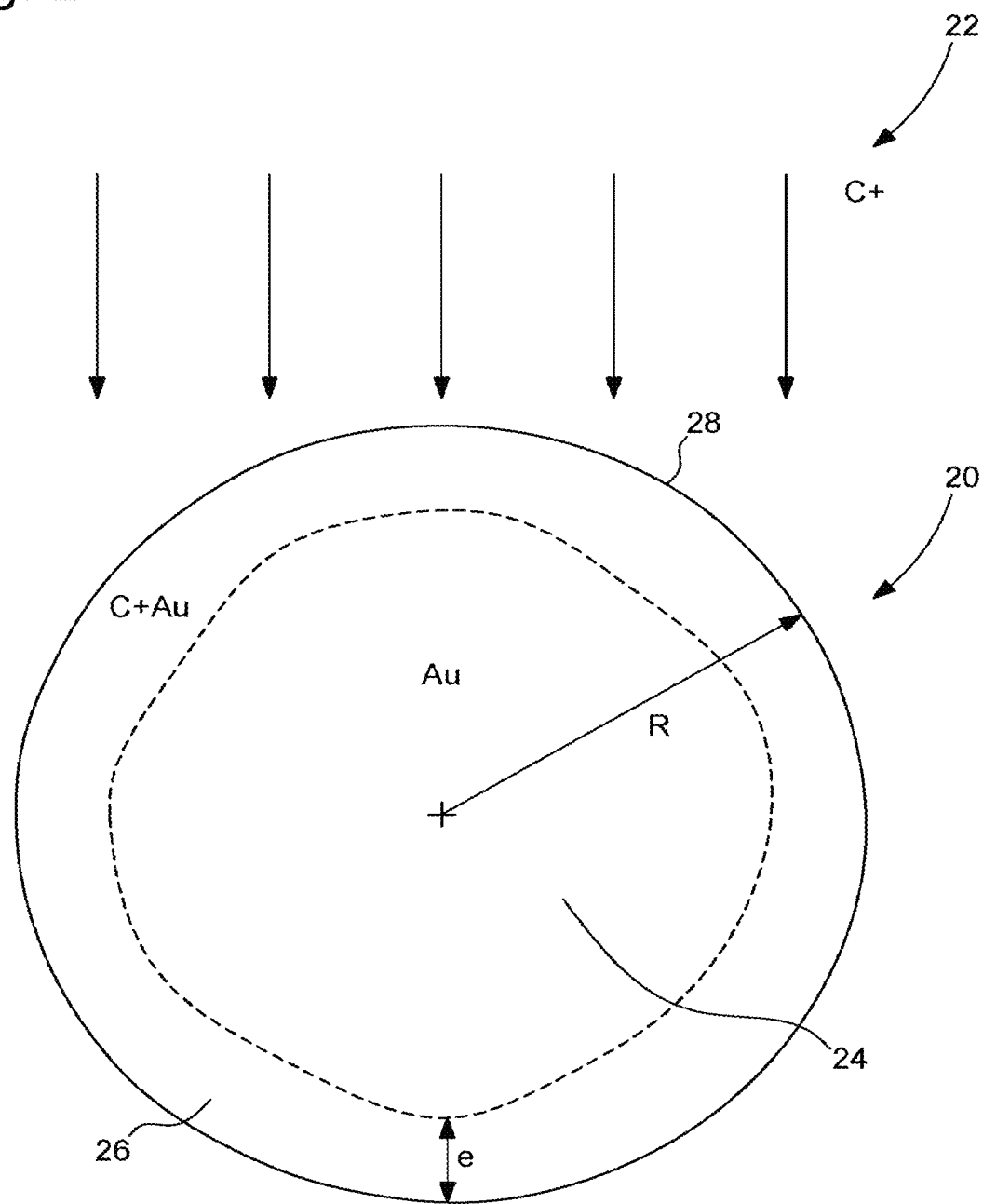
FIG. 2 is a sectional view of a gold particle Au whose radius is about 1 micrometre and which has been bombarded with a $C^+$ carbon ion beam.

FIG. 2 is a sectional view of a gold particle Au. Denoted as a whole by the general reference numeral 20, this gold particle has a substantially spherical shape with a radius R of about 1 micrometre. Said gold particle 20 has been bombarded using a $C^+$ carbon ion beam denoted by the reference numeral 22. As shown in FIG. 2, the gold particle 20 has a core 24 made of pure gold and an outer layer or shell 26 mainly constituted from gold carbide.

The thickness e of said outer layer 26 is about one tenth of the radius R of the gold particle 20, i.e. about 100 nanometres. This outer layer 26 is mostly constituted from gold carbide, which is a ceramic material. According to the invention, the concentration of ceramic material increases from the outer surface 28 of the gold particle 20 to about 5% of the radius R of said gold particle 20, i.e. about 50 nanometres, then decreases to about one tenth of the radius R of the gold particle 20, where it is substantially zero.

Thanks to the method according to the invention, particles are obtained, for example made of gold or platinum, whose core is constituted from the original metal, whereas an outer layer that fully surrounds the core of said particles is constituted from a ceramic material, for example a carbide or nitride, which results from the combination of the metal atoms with the ions with which the particles are bombarded.

According to the invention, this method uses a powder formed from a plurality of particles of a metal material to be treated. This metal material can be, however is not limited to, a precious metal selected from the group comprising gold and platinum. It can also be a non-precious metal selected from the group comprising magnesium, titanium and aluminium.

Figure 3:
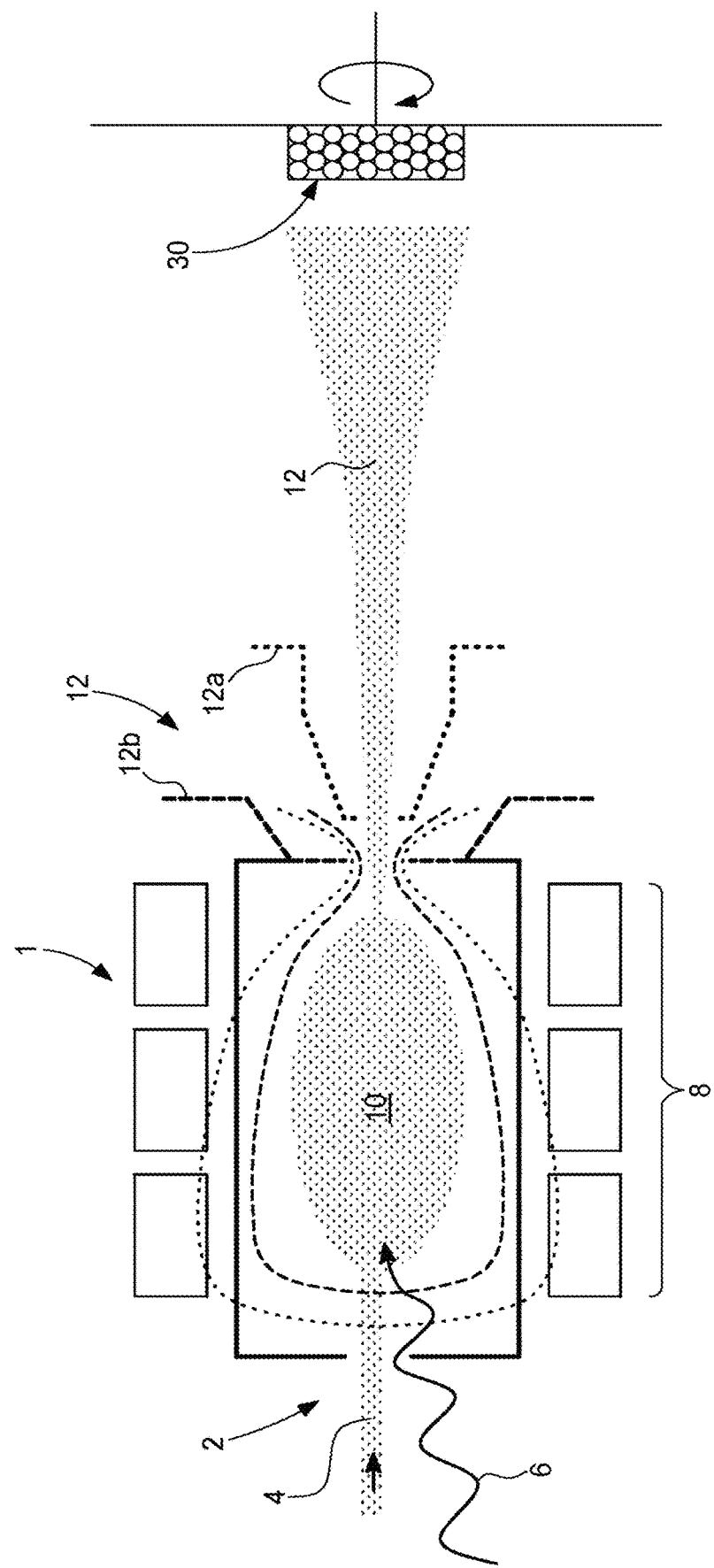
FIG. 3 is a diagrammatic view of a multi-charged ion source of the ECR electron cyclotron resonance type used within the scope of this invention.

Having chosen the metal to suit the needs, the metal powder particles 30 are subjected to an ion implantation process by directing a singly-charged or multi-charged ion beam 14 towards an outer surface of said particles, said ion beam being produced by a singly-charged or multi-charged ion source of the ECR electron cyclotron resonance type (see FIG. 3).

Preferably, however in a non-limiting manner, the material to be ionised is chosen from the group comprising carbon, nitrogen, oxygen and argon, and the singly-charged or multi-charged ions are accelerated under voltages in the range 15,000 to 35,000 volts. The dose of ions implanted lies in the range $1 \cdot 10^{15}$ to $1 \cdot 10^{17}$ ions·cm$^{-2}$.

The metal powder particles 30 have an overall spherical shape with a radius R and the grain size thereof is such that about 50% of all of said particles has a diameter that lies in the range 1 to 2 micrometres, whereby the diameter of the metal powder particles 30 does not exceed 50 micrometres. Preferably, the metal powder particles 30 are agitated throughout the duration of the ion implantation process to ensure that said particles are exposed to the ion beam 14 in a homogeneous manner over the entire outer surface thereof.

Figure 4B:
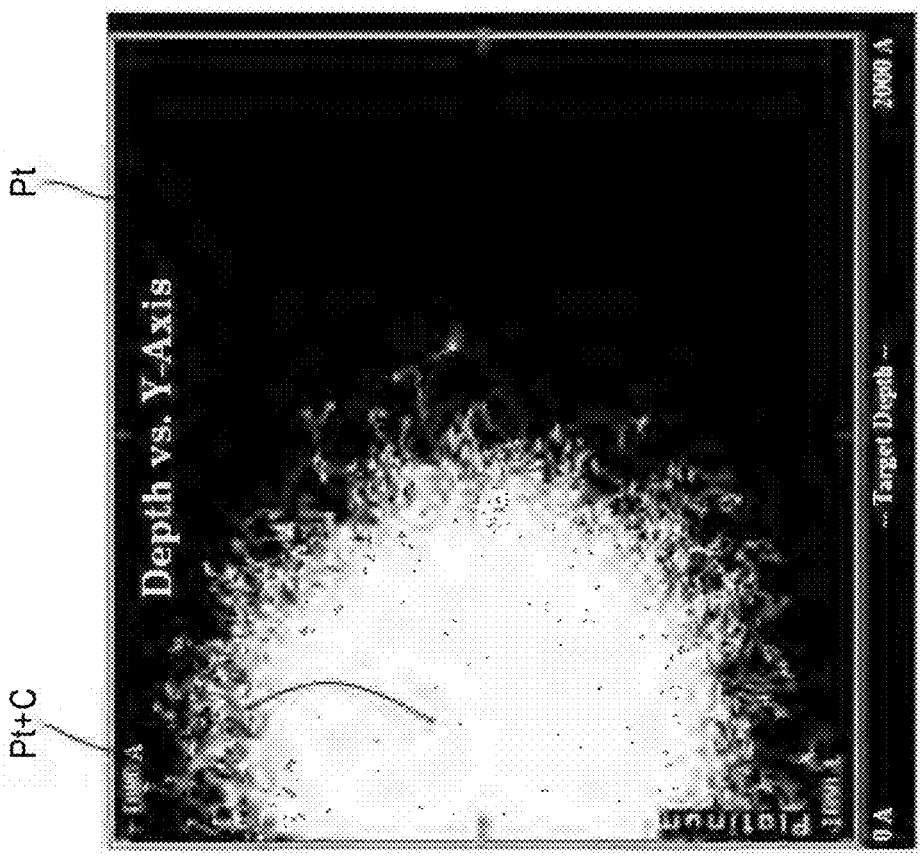
FIG. 4B is an expanded view in the plane of a substantially spherical platinum particle Pt whose radius is approximately 1 micrometre and which shows the penetration trajectory of the $C^+$ carbon ions in the particle.
Figure 4A:
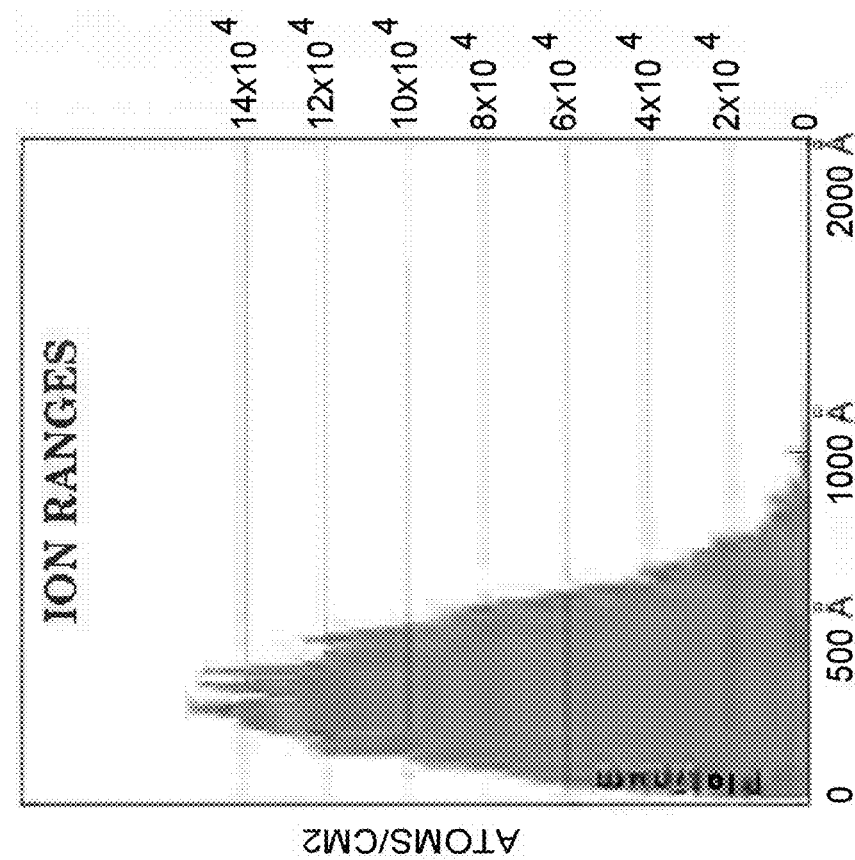
FIG. 4A shows the implantation profile of the $C^+$ carbon ions in a platinum particle Pt, the radius whereof is about 1 micrometre.

FIG. 4A shows the implantation profile of the C$^+$ carbon ions in a platinum particle Pt, whose radius is about 1 micrometre. The abscissa extends along the radius R of the platinum particle Pt, where the origin of said abscissa corresponds to the outer surface of the platinum particle, and where the value of 2,000 Ångströms corresponds to about 20% of the length of the radius R of the platinum particle Pt. The ordinate shows the number of C$^+$ carbon ions implanted in the platinum particle Pt at a given depth. It can be seen that the number of C$^+$ carbon ions implanted in the platinum particle Pt increases very quickly from the outer surface of the platinum particle to reach a maximum that exceeds $14 \times 10^4$ atoms·cm$^{-2}$ at a depth substantially corresponding to 500 Ångströms, i.e. approximately 5% of the radius R of the platinum particle. Then, the number of C$^+$ carbon ions decreases and approaches zero at approximately 1,000 Ångströms in depth, i.e. about 10% of the radius R of the platinum particle Pt.

FIG. 4B is an expanded view in the plane of a substantially spherical platinum particle Pt, whose radius is approximately 1 micrometre and which shows the average free trajectory of the individual C$^+$, C$^{++}$ carbon ions, etc. when they penetrate a platinum particle Pt. This FIG. 4B was drawn up for a density of about $14 \times 10^4$ atoms·cm$^{-2}$. The abscissa in FIG. 4B shows the depth of the platinum particle Pt between the surface (0 Ångströms) and 2,000 Ångströms. The ordinate in FIG. 4B shows the diameter of the C$^+$ carbon ion beam. The centre of the C$^+$ carbon ion beam is located midway along the height of the ordinate, between the values −1,000 Ångströms and +1,000 Ångströms. It can thus be seen in FIG. 4B that the approximate diameter of the C$^+$ carbon ion beam is about 150 nanometres and that the penetration depth of the C$^+$ carbon ions in the platinum particle Pt barely exceeds more than 100 nanometres.

Figure 5B:
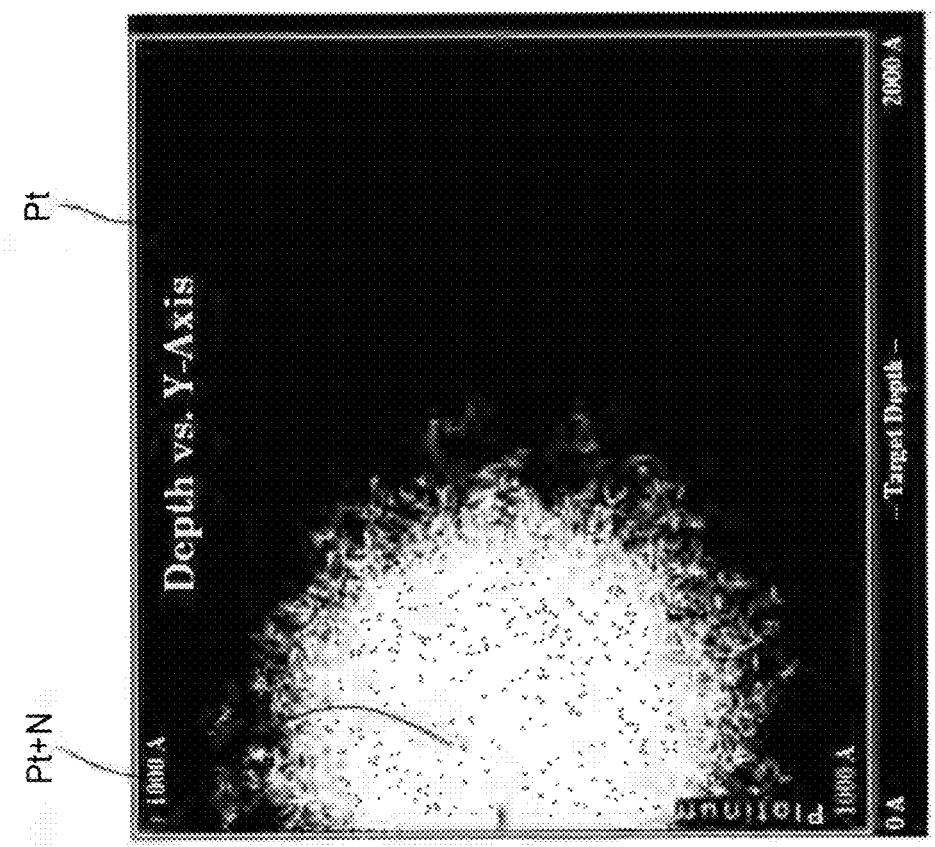
FIG. 5B is an expanded view in the plane of a platinum particle Pt whose radius is approximately 1 micrometre and which shows the penetration trajectory of the $N^+$ nitrogen ions in the particle.
Figure 5A:
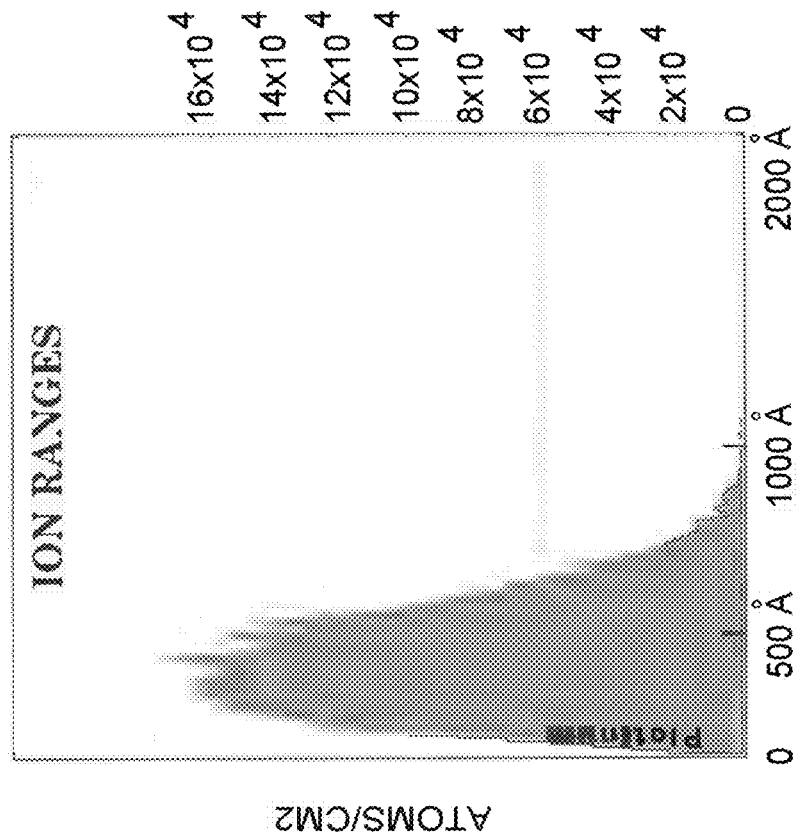
FIG. 5A shows the implantation profile of the $N^+$ nitrogen ions in a platinum particle Pt whose radius is about 1 micrometre.

FIG. 5A shows the implantation profile of the N$^+$ nitrogen ions in a platinum particle Pt, whose radius R is about 1 micrometre. The abscissa extends along the radius R of the platinum particle Pt, where the origin of said abscissa corresponds to the outer surface of the platinum particle Pt, and where the value of 2,000 Ångströms corresponds to about 20% of the length of the radius R of the platinum particle Pt. The ordinate shows the number of N$^+$ nitrogen ions implanted in the platinum particle Pt at a given depth. It can be seen that the number of N$^+$ nitrogen ions implanted in the platinum particle Pt increases very quickly from the outer surface of the platinum particle Pt to reach a maximum that exceeds $16 \times 10^4$ atoms·cm$^{-2}$ at a depth substantially corresponding to 500 Ångströms, i.e. approximately 5% of the radius R of the platinum particle Pt. Then, the number of N$^+$ nitrogen ions decreases and approaches zero at a depth of about 1,000 Ångströms from the outer surface of the platinum particle Pt, i.e. about 10% of the radius R of said platinum particle Pt.

By comparing FIGS. 4A and 5A, the N$^+$ nitrogen ions can be seen to penetrate the crystallographic lattice of the platinum particle Pt to a lesser degree than the C$^+$ carbon ions.

FIG. 5B is an expanded view in the plane of a substantially spherical platinum particle Pt, the radius thereof being approximately 1 micrometre and which shows the average free trajectory of the individual N$^+$, N$^{++}$ nitrogen ions, etc. when they penetrate a platinum particle Pt. This FIG. 5B was drawn up for a density of about $16 \times 10^4$ atoms·cm$^{-2}$. The abscissa in FIG. 5B shows the depth of the platinum particle Pt between the surface (0 Ångströms) and 2,000 Ångströms. The ordinate in FIG. 5B shows the diameter of the N$^+$ nitrogen ion beam. The centre of the N$^+$ ion beam is located midway along the height of the ordinate, between the values 1,000 Ångströms and +1,000 Ångströms. It can thus be seen in FIG. 5B that the approximate diameter of the N$^+$ ion beam is about 150 nanometres and that the penetration depth of the N$^+$ ions in the platinum particle Pt is slightly less than 100 nanometres. It is thus clear that the N$^+$ ions penetrate the platinum particles to a lesser than the C$^+$ ions.

Figure 6B:
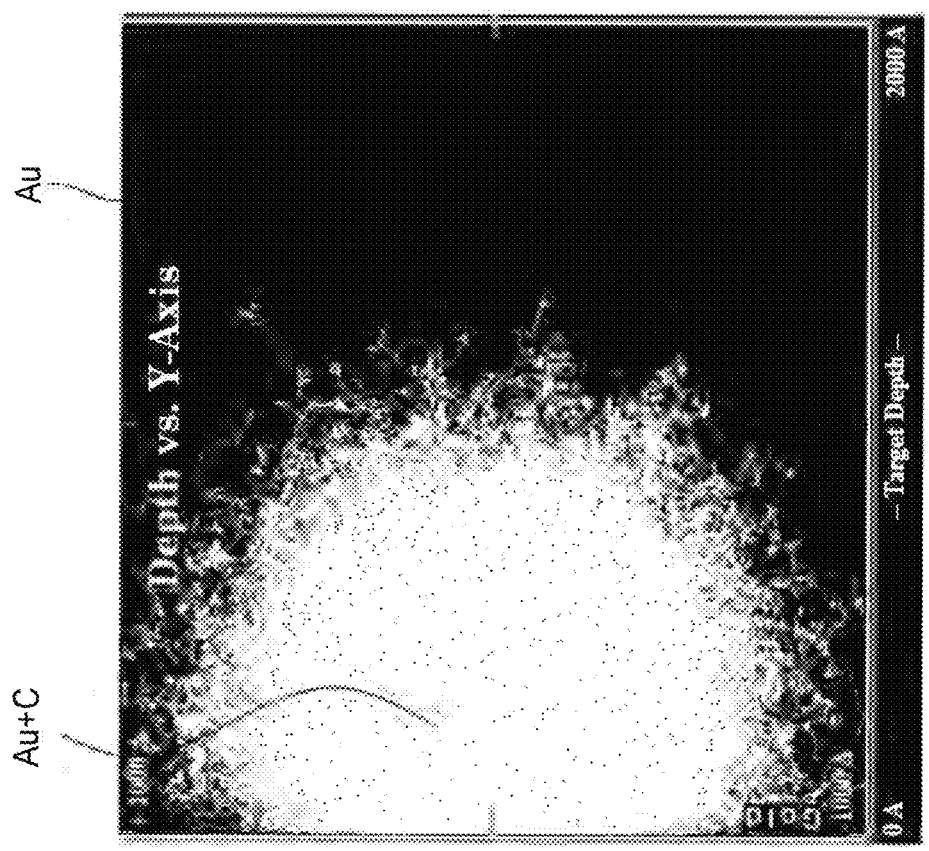
FIG. 6B is an expanded view in the plane of a substantially spherical gold particle Au whose radius is approximately 1 micrometre and which shows the penetration trajectory of the $C^+$ carbon ions in the particle.
Figure 6A:
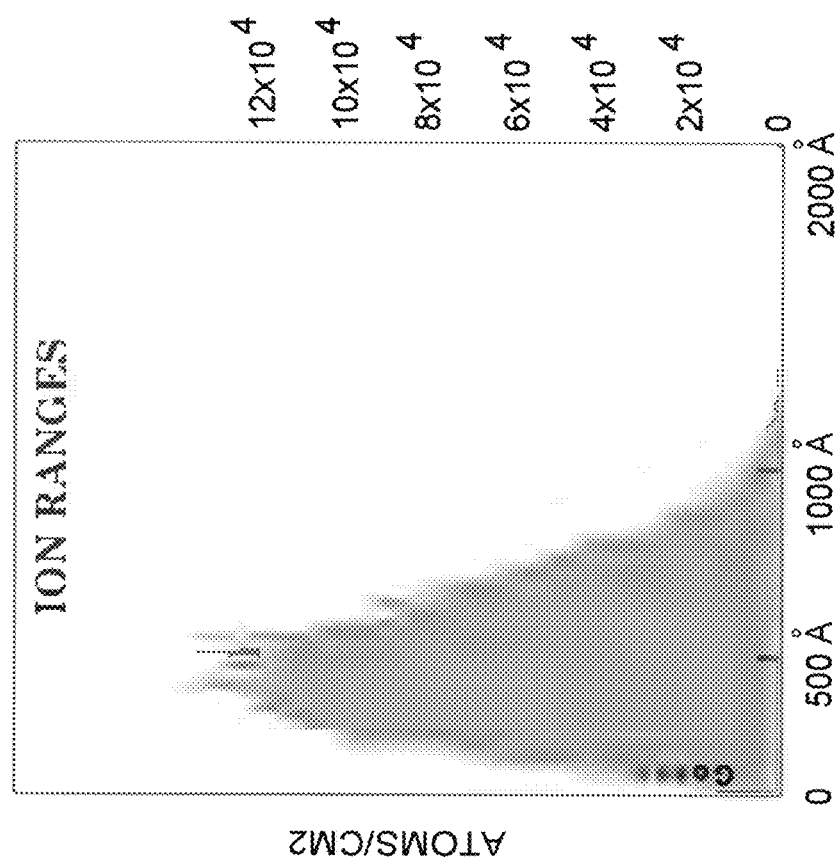
FIG. 6A shows the implantation profile of the $C^+$ carbon ions in a gold particle Au whose radius is about 1 micrometre.

FIG. 6A shows the implantation profile of the C$^+$ carbon ions in a gold particle Au, the radius R thereof being about 1 micrometre. The abscissa extends along a radius R of the gold particle Au, where the origin of said abscissa corresponds to the outer surface of the gold particle Au, and where the value of 2,000 Ångströms corresponds to about 20% of the radius R of the gold particle Au. The ordinate shows the number of C$^+$ carbon ions implanted in the gold particle Au at a given depth. It can be seen that the number of C$^+$ carbon ions implanted in the gold particle Au increases very quickly from the outer surface of the gold particle Au to reach a maximum that exceeds $12 \times 10^4$ atoms·cm$^{-2}$ at a depth of 500 Ångströms, approximately 5% of the radius R of the gold particle Au. Then, the number of ions decreases and approaches zero at about 1,000 nm below the outer surface of the gold particle Au, i.e. about 10% of the length of the radius R of the particle.

FIG. 6B is an expanded view in the plane of a substantially spherical gold particle Au, the radius thereof being approximately 1 micrometre and which shows the average free trajectory of the individual C$^+$, C$^{++}$ carbon ions, etc. when they penetrate a gold particle Au. This FIG. 6B was drawn up for an ion density of about $12 \times 10^4$ atoms·cm$^{-2}$. The abscissa in FIG. 6B shows the depth of the gold particle Au between the surface (0 Ångströms) and 2,000 Ångströms. The ordinate in FIG. 6B shows the diameter of the C$^+$ carbon ion beam. The centre of the C$^+$ ion beam is located midway along the height of the ordinate, between the values −1,000 Ångströms and +1,000 Ångströms. It can thus be seen in FIG. 6B that the approximate diameter of the C$^+$ ion beam is about 150 nanometres and that the penetration depth of the $C^+$ ions in the gold particle Au slightly exceeds 100 nanometres.

Figure 7B:
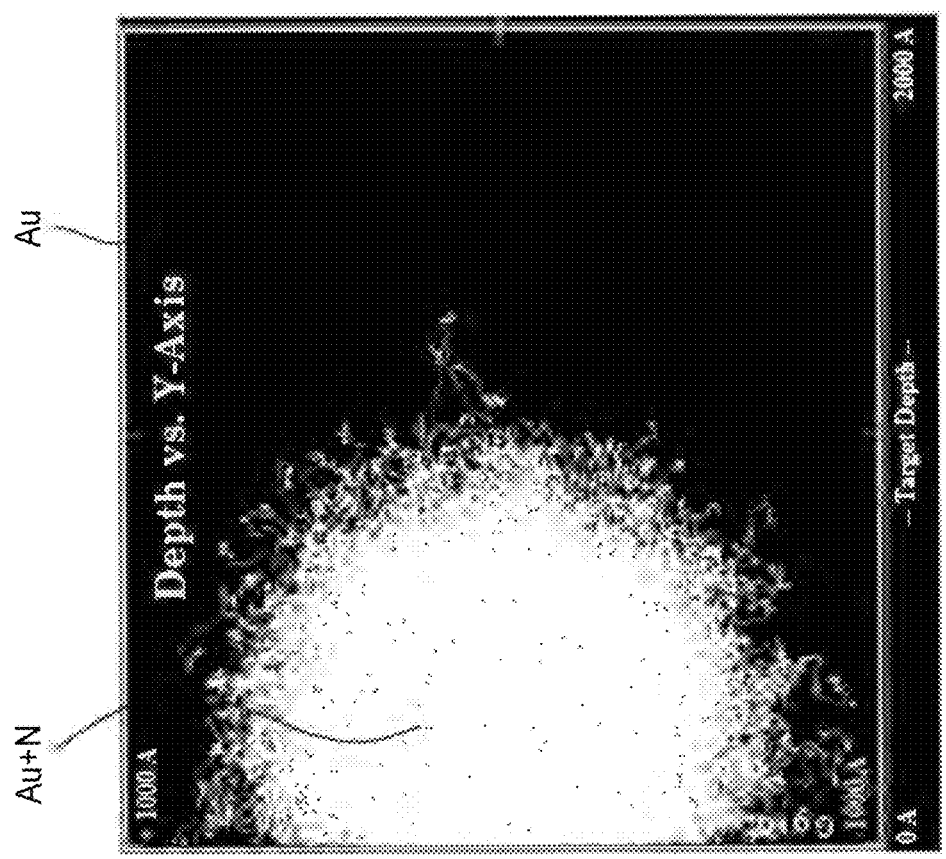
FIG. 7B is an expanded view in the plane of a gold particle Au, the radius thereof being approximately 1 micrometre and which shows the penetration trajectory of the $N^+$ nitrogen ions in the particle.
Figure 7A:
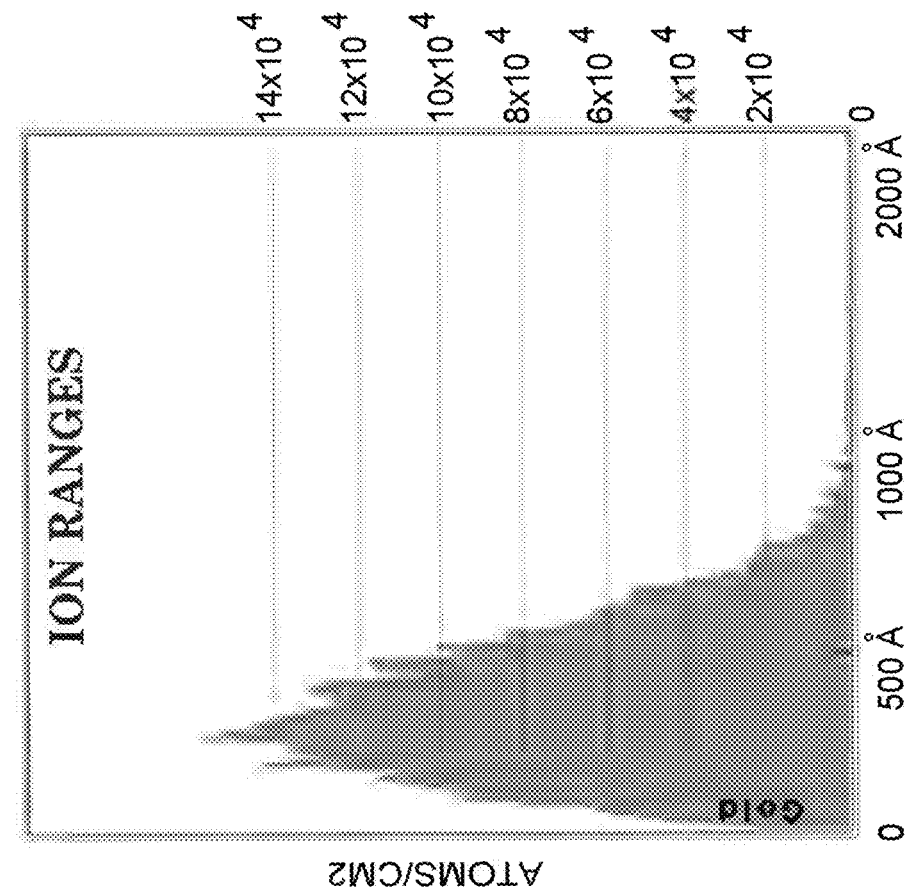
FIG. 7A shows the implantation profile of the $N^+$ nitrogen ions in a gold particle Au whose radius is about 1 micrometre.

FIG. 7A shows the implantation profile of the $N^+$ nitrogen ions in a gold particle Au, whose radius is about 1 micrometre. The abscissa extends along a radius R of the gold particle Au, where the origin of said abscissa corresponds to the outer surface of the gold particle Au, and where the value of 2,000 Ångströms corresponds to about 20% of the radius R of the gold particle Au. The ordinate shows the number of $N^+$ nitrogen ions implanted in the gold particle Au at a given depth. It can be seen that the number of $N^+$ nitrogen ions implanted in the gold particle Au increases very quickly from the outer surface of the gold particle Au to reach a maximum that exceeds $14\times10^4$ atoms·cm$^{-2}$ at a depth of 500 Ångströms, i.e. approximately 5% of the length of the radius R of the gold particle Au. Then, the number of $N^+$ nitrogen ions decreases and approaches zero at about 1,000 nm below the outer surface of the gold particle Au, i.e. about 10% of the length of the radius R of the particle.

FIG. 7B is an expanded view in the plane of a substantially spherical gold particle Au, the radius whereof is approximately 1 micrometre and which shows the average free trajectory of the individual $N^+$, $N^{++}$ nitrogen ions, etc. when they penetrate a gold particle Au. This FIG. 7B was drawn up for an ion density of about $14\times10^4$ atoms·cm$^{-2}$. The abscissa in FIG. 7B shows the depth of the gold particle Au between the surface (0 Ångströms) and 2,000 Ångströms. The ordinate in FIG. 7B shows the diameter of the $N^+$ azote ion beam. The centre of the $N^+$ nitrogen ion beam is located midway along the height of the ordinate, between the values −1,000 Ångströms and +1,000 Ångströms. It can thus be seen in FIG. 7B that the approximate diameter of the $N^+$ nitrogen ion beam is about 150 nanometres and that the penetration depth of the $N^+$ ions in the gold particle Au is about 100 nanometres. It is thus clear that the $N^+$ nitrogen ions penetrate the gold particles Au to a lesser degree than the $C^+$ ions.

It is evident that this invention is not limited to the embodiment described above and that various simple alternatives and modifications can be considered by one of ordinary skill in the art without leaving the scope of the invention as defined by the accompanying claims. In particular, it is understood that the ion implantation process of the ECR electron cyclotron resonance type is stipulated in the form of a preferred example but in no way limiting the scope of the invention, and that other hot plasma generation processes, for example by induction or using a strong magnetic field produced by a microwave generator can be considered. It should also be noted that additional measurements performed by transmission electron microscopy on sapphire particles with an average diameter of 2.0 micrometres implanted by nitrogen confirm that the sapphire particles, after ion implantation, have a ceramic shell with a thickness of about 150 to 200 nanometres. It should also be noted that the ratio between the volume of the particles that is irradiated and the total volume of the particles is equal to about 14%. From the perspective of the Applicant, the powder obtained by the ion implantation method according to the invention is not a real composite material. More specifically, with regard to the widely-accepted meaning thereof, a composite material is the result of the combination of two different materials, namely a matrix and a reinforcement. In this case, the description only concerns a single material in which ion bombardment results in a modification to the chemical structure at the surface. This could therefore preferably be referred to as a heterogeneous material.

Finally, it should be noted that, according to the invention, the ECR ion source is capable of producing singly-charged ions, i.e. ions with a degree of ionisation equal to 1, or multi-charged ions, i.e. ions with a degree of ionisation greater than 1. It should also be noted that the ion beam can comprise ions all having the same degree of ionisation, or can result from a mixture of ions having different degrees of ionisation.

NOMENCLATURE

1. ECR multi-charged ion source
2. Injection stage
4. Volume of a gas to be ionised
6. Microwave
8. Magnetic confinement stage
10. Plasma
12. Extraction stage
12a. Anode
12b. Cathode
14. Multi-charged ion beam
16. Surface
18. Part to be treated
20. Gold particle Au
R. Radius
22. $C^+$ carbon ion beam
24. Core
26. Outer layer or shell
e. Thickness
28. Outer surface
30. Metal powder particles

The invention claimed is:

1. A material in a powder state formed from a plurality of particles having a ceramic outer layer and a metal core, the particles having an overall spherical shape with a radius (R), the ceramic outer layer comprising a ceramic material corresponding to a carbide or a nitride of a metal of which the metal core of the particles is made, a concentration of the ceramic material increasing from an outer surface of the particles to a given depth of the particles beyond which the concentration of the ceramic material decreases and becomes zero.

2. The material according to claim 1, wherein the carbide or the nitride is formed by a combination of implanted carbon ions or implanted nitrogen ions with atoms of the metal.

3. The material according to claim 1, wherein about 50% of the particles have a diameter in a range of 1 micrometre to 2 micrometres, and the remaining percentage of the particles have a diameter that does not exceed 50 micrometres.

4. The material according to claim 1, wherein the metal core is a precious metal selected from among gold and platinum.

5. The material according to claim 1, wherein the metal core is a nonprecious metal selected from among magnesium, titanium, and aluminium.

6. The material according to claim 1, wherein the concentration of the ceramic material increases from the outer surface of the particles to a depth of about 5% of a length of the radius (R) of the particles, and then decreases from the depth of about 5% of the length of the radius (R) of the particles until a further depth below the outer surface of about 10% of the length of the radius (R) of the particles at which point the concentration of the ceramic material is substantially zero.

\* \* \* \* \*